(12) United States Patent
Zimmer et al.

(10) Patent No.: US 8,861,290 B2
(45) Date of Patent: Oct. 14, 2014

(54) SYSTEM AND METHOD FOR PERFORMING SRAM WRITE ASSIST

(71) Applicant: NVIDIA Corporation, Santa Clara, CA (US)

(72) Inventors: Brian Matthew Zimmer, Berkeley, CA (US); Mahmut Ersin Sinangil, Medford, MA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/710,314

(22) Filed: Dec. 10, 2012

(65) Prior Publication Data
US 2014/0160871 A1    Jun. 12, 2014

(51) Int. Cl.
*G11C 7/00*    (2006.01)
*G11C 7/12*    (2006.01)

(52) U.S. Cl.
CPC .......................................... *G11C 7/12* (2013.01)
USPC .................................... 365/189.16; 365/233.5

(58) Field of Classification Search
USPC ......................................... 365/189.16, 233.5
See application file for complete search history.

(56) References Cited

U.S. PATENT DOCUMENTS

2011/0089970 A1*    4/2011 Chandler et al. ................ 326/38

OTHER PUBLICATIONS

Dolecek, L. et al., "Breaking the Simulation Barrier: SRAM Evaluation Through Norm Minimization," IEEE, 2008, pp. 322-329.
Yabuuchi, M. et al., "A 45nm 0.6V Cross-Point 8T SRAM with Negative Biased Read/Write Assist," 2009 Symposium on VLSI Circuits Digest of Technical Papers, 2009, pp. 158-159.
Pilo, H. et al., "A 64 Mb SRAM in 32 nm High-k Metal-Gate SOI Technology With 0.7 V Operation Enabled by Stability, Write-Ability and Read-Ability Enhancements," IEEE Journal of Solid-State Circuits, Jan. 2012, vol. 47, No. 1, pp. 1-10.
Karl, E. et al., "A 4.6GHz 162Mb SRAM Design in 22nm Tri-Gate CMOS Technology with Integrated Active VMIN-Enhancing Assist Circuitry," 2012 IEEE International Solid-State Circuits Conference, 2012.

* cited by examiner

*Primary Examiner* — Michael Tran
(74) *Attorney, Agent, or Firm* — Zilka-Kotab, PC (57) ABSTRACT

A method and a system are provided for performing write assist. Write assist circuitry is initialized and voltage collapse is initiated to reduce a column supply voltage provided to a storage cell. A bitline of the storage cell is boosted to a boosted voltage level that is below a low supply voltage provided to the storage cell and data encoded by the bitline is written to the storage cell.

20 Claims, 9 Drawing Sheets

SYSTEM AND METHOD FOR PERFORMING SRAM WRITE ASSIST

This invention was made with Government support under LLNS subcontract B599861 awarded by DOE. The Government has certain rights in this invention.

FIELD OF THE INVENTION

The present invention relates to storage circuits, and, more specifically to write assist.

BACKGROUND

Reducing operation supply voltage (Vmin) is an effective strategy to improve energy efficiency for integrated circuits. However, write operations for static random access memory (SRAM) storage cells may become unreliable at lower operation supply voltages due to variations in circuit characteristics, such as threshold voltages, resulting from fabrication technology and/or the age of the integrated circuit device.

To write a conventional 6-transitor storage cell, the data to be written is encoded as differential values on bitlines (BL and BLB). For example, data=0 is encoded as BL=0 and BLB=1 and data=1 is encoded as BL=1 and BLB=0, where 1 (TRUE) is a high voltage level and 0 (FALSE) is a low voltage level. When a word line is enabled, NMOS (N-type metal-oxide semiconductor) transistor pass gates that couple a pair of bitlines to the memory element within the storage cell are activated. The pass gates must overcome the strength of the cross-coupled inverters that form the memory element to change the contents of the storage cell to match the data encoded on the bitlines, thus completing the write operation. In particular, variation in the circuit characteristics can strengthen a PMOS (p-type metal-oxide semiconductor) pull-up transistor of the memory element and weaken an NMOS pass gate, preventing transfer of a 0 encoded on one of the bitlines to the memory element. As a result, the SRAM storage cell cannot be reliably written.

Thus, there is a need for addressing the issue of write reliability and/or other issues associated with the prior art.

SUMMARY

A system and method are provided for performing write assist. Write assist circuitry is initialized and voltage collapse is initiated to reduce a column supply voltage provided to a storage cell. A bitline of the storage cell is boosted to a boosted voltage level that is below a low supply voltage provided to the storage cell and data encoded by the bitline is written to the storage cell.

DETAILED DESCRIPTION

As previously explained, variation in the circuit characteristics can strengthen a PMOS pull-up transistor of the memory element and weaken an NMOS pass gate so that the storage cell may not be written reliably. Unfortunately, changing the size of the PMOS pull-up transistor to weaken the PMOS pull-up and changing the size of the NMOS pass gate transistor to strengthen the NMOS pass gate is not an effective technique to improve write reliability. For example, when the storage cell is implemented using finFETs, the size of the storage cell is quantized based on the number of fins. What this means is that for various design reasons, transistor sizing is not an effective technique to improve write reliability, even when variations in the circuit characteristics are minimal. Write assist weakens the PMOS pull-up transistor and strengthens the NMOS pass gate to improve write reliability without relying on changing sizes of the transistors. The write assist is enabled during write operations and is disabled during read operations to avoid unwanted side-effects during read operations.

Figure 1A:
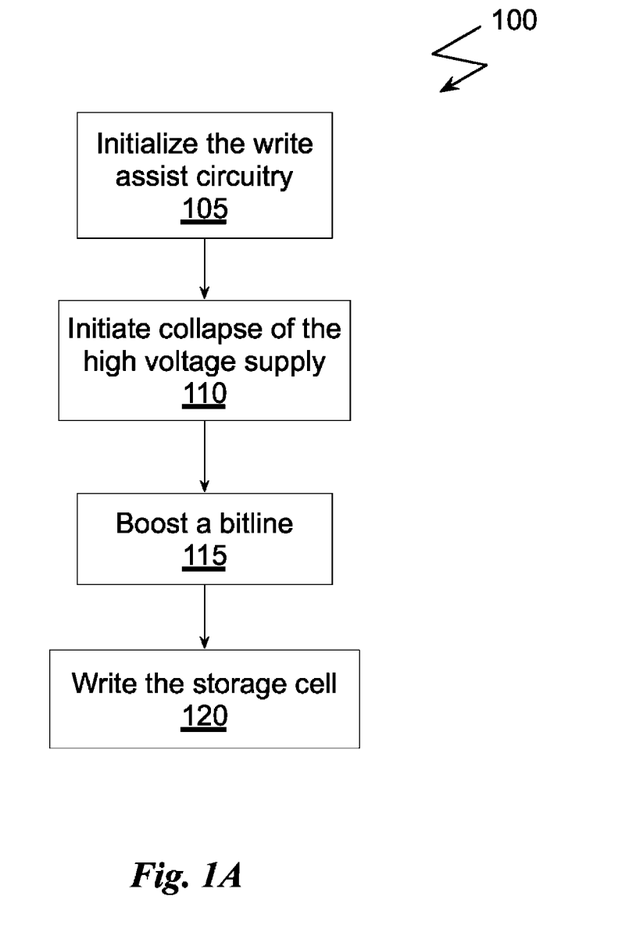
FIG. 1A illustrates a flowchart of a method for performing write assist using coupled supply voltage and bitline, in accordance with one embodiment.

FIG. 1A illustrates a flowchart of a method 100 for performing write assist using a coupled supply voltage and bitline, in accordance with one embodiment. At step 105, the write assist circuitry is initialized. At step 110, collapse of the high voltage supply provided to a storage cell to be written is initiated. The collapse reduces the supply voltage provided to the storage cell being written. At step 115, a bitline of the storage cell is boosted. Specifically, the bitline encoding the low differential value of the data (i.e., the negative bitline) is boosted by lowering the voltage of the negative bitline below the low voltage supply level (e.g., VSS) provided to the storage cell, which is typically ground. At step 120, the storage cell is written with the data.

More illustrative information will now be set forth regarding various optional architectures and features with which the foregoing technique may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1B:
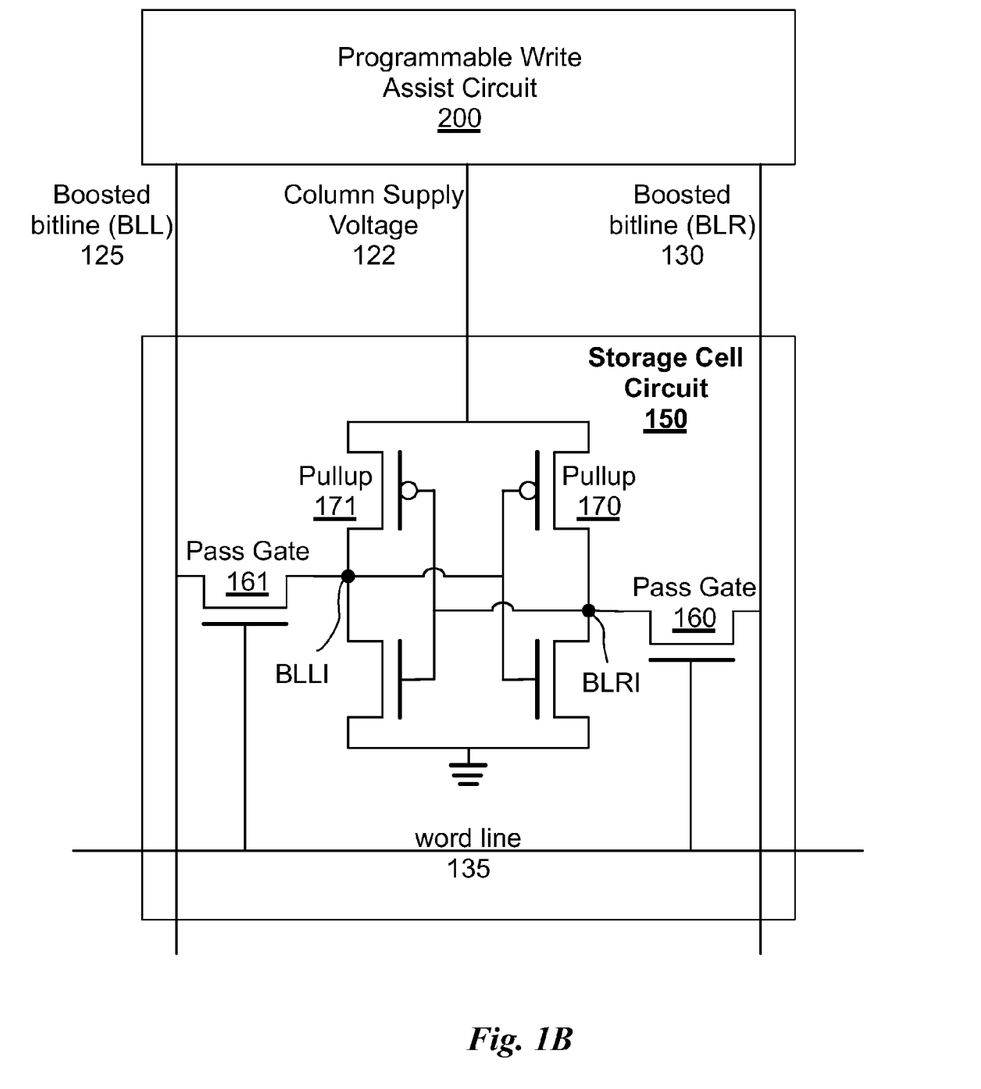
FIG. 1B illustrates a storage cell circuit coupled to a programmable write assist circuit, in accordance with one embodiment.

FIG. 1B illustrates a storage cell circuit 150 coupled to a programmable write assist circuit 200, in accordance with one embodiment. As shown, the storage cell circuit 150 is a conventional 6-transistor SRAM storage cell that is configured to perform a write operation by transferring data encoded on differential bitlines (i.e., BLL 125 and BLR 130) to a memory element when the word line 135 is asserted. As previously explained, a write operation can fail due to variations in the circuit characteristics resulting from fabrication technology when write assist is not used.

For example, assuming boosted bitline 125 (BLL) is equal to 0 and boosted bitline 130 (BLR) is equal to 1 and the storage cell circuit 150 holds the opposite value where BLLI=1 and BLRI=0. As a first consideration, the pass gate 161 that is coupled to BLL=0 should be strong enough to overpower the pullup 171 holding the internal node BLLI high. Circuit characteristic variation can strengthen the pullup 171 and weaken the pass gate 161, preventing BLLI from transitioning from 1 to 0. Additionally, the pullup 170 on the opposite side of the storage cell circuit 150 should be strong enough to pull BLRI high when the pullup 170 turns on. Note that the pass gate 160 is an NMOS transistor, and therefore, does not assist pulling BLRI high from a low voltage. The write assist technique described further herein weakens the pullup 171 while also strengthening the pass gate 161 and the pullup 170 to improve write reliability for BLL=0 and BLR=1. Conversely, to improve write reliability for BLL=1 and BLR=0, the pullup 170 is weakened while the pass gate 160 and the pullup 171 are strengthened. The write assist technique may be applied only during a write operation to avoid unwanted side-effects during read operations.

Write assist is achieved by a combination of boosting the negative bitline and collapsing the column supply voltage 122 for the storage cell that is written. The negative bitline boost operation lowers the voltage level of the bitline that encodes the low differential value for the data (i.e., the negative bitline) below a low supply voltage provided to the storage cell. As shown in FIG. 1B, the programmable write assist circuit 200 is configured to provide a boosted value to the negative bitline of the storage cell circuit 150 during a write operation via the boosted bitline 125 (BLL) and the boosted bitline 130 (BLR). The programmable write assist circuit 200 is configured to collapse the column supply voltage 122 provided to the storage cell circuit 150 during a write operation by reducing the column supply voltage 122 from the high supply voltage (VDD) to a collapsed voltage level that is lower than the high supply voltage. Collapsing the column supply voltage 122 reduces the voltage level provided to the pullup 171 and pullup 170 of the storage cell circuit 150.

Boosting the negative bitline, i.e., BLL 125, increases the gate source voltage (Vgs) of the pass gate 161 and BLLI is pulled lower compared with providing the (non-boosted) low supply voltage at BLL 125. The source gate voltage (Vsg) on the pullup 170 is increased, thereby strengthening the pullup 170 and the pass gate 161. The voltage collapse reduces the column supply voltage 122 and decreases the Vsg on the pullup 171, thereby weakening the pullup 171. Note that using high supply voltage collapse alone will also decrease the strength of the pullup 170 (which is not desired) and pulling BLRI high will be more difficult. However, combining the negative bitline boost with the high supply voltage collapse counteracts the decrease in strength of the pullup 170.

In another example, the boosted bitline 130 BLR=0, the boosted bitline 125 BLL=1, and the storage cell circuit 150 holds the opposite value where BLLI=0 and BLRI=1. The programmable write assist circuit 200 is configured to boost the negative bitline BLR 130 and collapse the column supply voltage 122 during a write operation. Boosting BLR 130 increases the Vgs of the pass gate 160, which will pull BLRI lower compared with providing the (non-boosted) low supply voltage (e.g., VSS) at the negative bitline BLR 130. The Vsg on the pullup 171 is increased, thereby strengthening the pullup 171 and the pass gate 160. The voltage collapse reduces the column supply voltage 122 and decreases the Vsg on the pullup 170, thereby weakening the pullup 170. Note that using high supply voltage collapse alone will also decrease the strength of the pullup 171 (which is not desired) and pulling BLLI high will be more difficult. However, combining the negative bitline boost with the high supply voltage collapse counteracts the decrease in strength of the pullup 171.

Although only a single storage cell circuit 150 is shown in FIG. 1B, multiple storage cell circuits 150 may be configured in an array having two or more rows. Each row is separately enabled, according to an address and the word line 135 is asserted to perform read and write operations. Storage cell circuits 150 in an array may be organized in one or more columns where a portion of the address is used to select between the different columns for read and write operations.

Figure 2A:
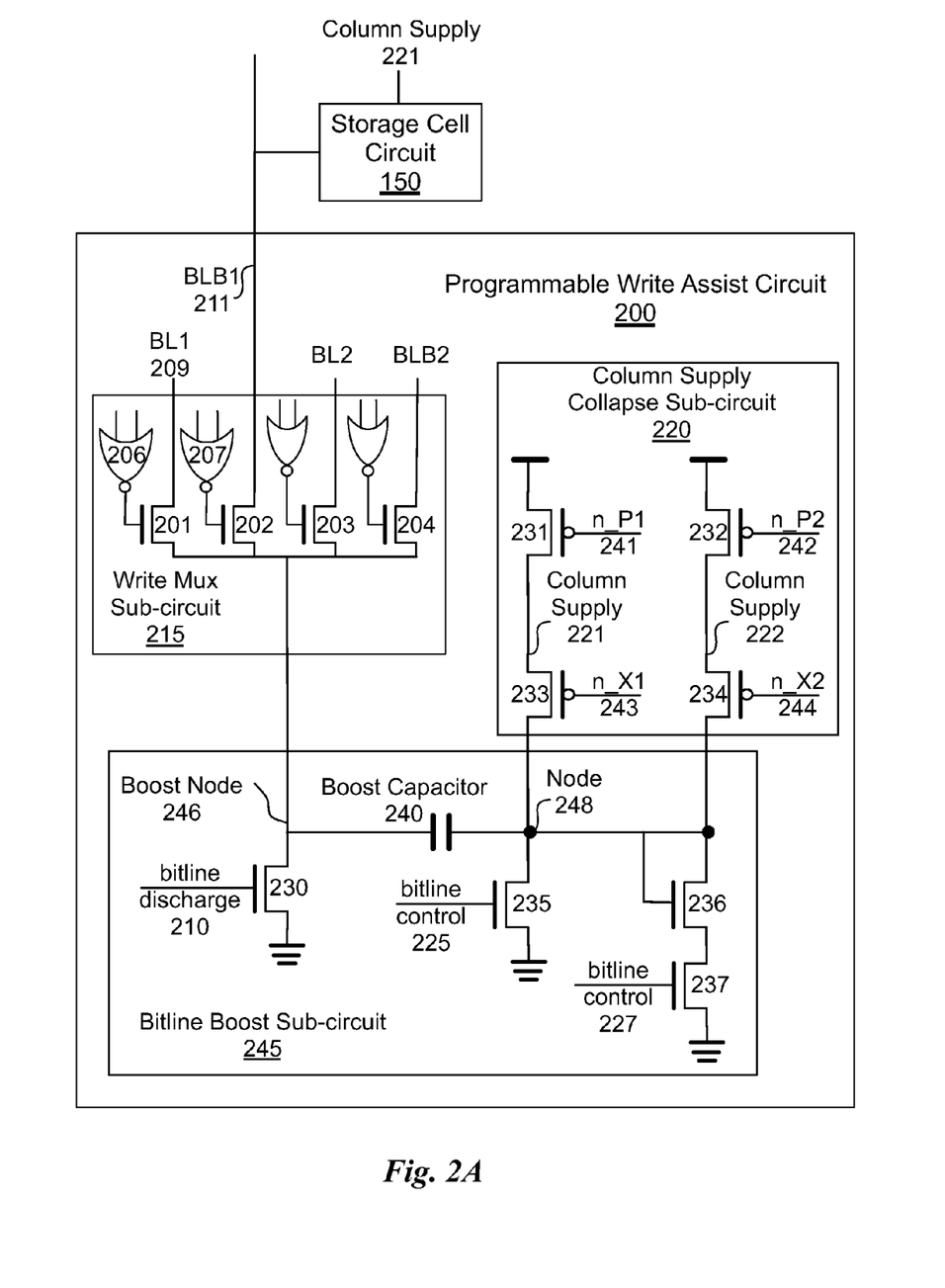
FIG. 2A illustrates the programmable write assist circuit of FIG. 1B, in accordance with one embodiment.

FIG. 2A illustrates the programmable write assist circuit 200 and storage cell circuit 150 of FIG. 1B, in accordance with one embodiment. The programmable write assist circuit 200 is coupled to the storage cell circuit 150. The programmable write assist circuit 200 includes a write mux (multiplexer) sub-circuit 215, a column supply collapse sub-circuit 220, and a bitline boost sub-circuit 245. As shown in FIG. 2A, 2 to 1 column bit interleaving is employed in the SRAM array that includes the storage cell circuit 150. BL1 209 and BLB1 211 are the differential bit lines corresponding to a first column and BL2 212 and BLB2 213 are the differential bit lines corresponding to a second column. The column supply 221 is the column supply voltage that is provided by the column supply collapse sub-circuit 220 to storage cell circuits 150 in the first column of the SRAM array and the column supply 222 is the column supply voltage that is provided to storage cell circuits 150 in the second column of the SRAM array. As shown, the bitline boost sub-circuit 245 can be shared between two columns of an SRAM array. The programmable write assist circuit 200 may also be used with no column interleaving or may be shared between more than two columns of the SRAM array.

Assuming that BLB1 211 is the negative bitline for a particular write operation, the write assist operation will boost BLB1 211 below the low supply voltage, and collapse the column supply voltage 120 provided to the storage cell circuit 150 (i.e., column supply 221). The bitline BL1 209 is the positive bitline and is set to a value of 1 (i.e., the high supply voltage).

The write mux sub-circuit 215 enables the gate of the NMOS transistor 202 corresponding to the negative bitline, BLB1 211. The gates of the NMOS transistors 201, 203, and 204 are disabled. The inputs to the NOR gate 207 are the data (to choose between BL1 209 and BLB1 211) and a combination of the column select and write enable (to select between column 1 or 2 when a write operation is enabled). The bitline discharge 210 is asserted by default, pulling BLB1 211 and the boost node 246 low (i.e., to ground) through the NMOS transistor 230. At this point, the node 248 needs to be pulled up to establish a voltage across the boost capacitor 240 and initialize the programmable write assist circuit 200 to perform the write assist operation.

In one embodiment, the voltage collapse portion of the write assist operation may be disabled. The n_P1 241 and n_P2 242 signals are used to enable/disable the voltage collapse for column 1 and 2, respectively. Specifically, n_P1 241 is negated to disable the voltage collapse for column 1 and pull up the column supply 221 through the PMOS transistor 231. Similarly, n_P2 242 is negated to disable the voltage collapse for column 2 and pull up the column supply 222 through the PMOS transistor 232. The write assist can be programmed to disable the voltage collapse when less write assist is needed. When the voltage collapse is enabled for column 1, n_P1 241 is asserted to write data to the storage cell circuit 150 in column 1, disabling the PMOS transistor 231 so the column supply 221 floats. Note that because the column supply 221 was previously pulled up to the high supply voltage, the floating column supply 221 is at a high voltage level.

To complete initialization of the programmable write assist circuit 200 for the negative bitline boost operation, a voltage is established across the boost capacitor 240. The n_X1 243 signal is negated to enable the PMOS transistor 233 within the column supply collapse sub-circuit 220 to pull up the node 248, establishing a voltage across the boost capacitor 240. When a write operation is performed for column 2, the n_X2 244 signal is negated to enable the PMOS transistor 234 to pull up the node 248. The voltage level that node 248 is pulled up to when the voltage collapse is enabled depends on the ratio between the capacitance on the column supply 221 (or column supply 222) and the boost capacitor 240. When the voltage collapse is not enabled, the node 248 is pulled up to the high supply voltage by the PMOS transistors 231 and 233 (or PMOS transistors 232 and 234).

In addition to establishing the voltage across the boost capacitor 240, enabling either PMOS transistor 233 or 234, lowers the column supply 221 or 222, respectively, when the voltage collapse is enabled because the column supply 221 or 222 is floating and is pulled to a partially collapsed level that is lower than the high supply voltage. Therefore, a partial voltage collapse is accomplished when the node 248 is pulled up to charge the boost capacitor 240 and initialize the negative bitline boost operation.

When the high supply voltage collapse is not enabled, the column supply 221 and column supply 222 remain at the high supply voltage when the PMOS transistor 233 or 234, respectively, is enabled to establish the voltage across the boost capacitor 240. The node 248 settles at the same voltage level as the column supply 221 or 222.

After the programmable write assist circuit 200 is initialized to perform the negative bitline boost operation the word line, e.g., word line 135, may be enabled to begin the write operation. Then, the negative bitline boost is initiated by negating the bitline discharge 210 to disable the NMOS transistor 230 and float the boost node 246. The bitline control 225 and 227 are configured to enable either NMOS transistor 235 or NMOS transistor 236 (which, in turn, activates the NMOS transistor 237) to pull down the node 248. Bitline control 225 and 227 provide different amounts of boost for the negative bitline boost. Asserting the bitline control 225 to enable the NMOS transistor 235 pulls the node 248 to ground. Asserting the bitline control 227 to enable the NMOS transistor 237 pulls the node 248 to Vth of the NMOS transistor 236. In other embodiments, a single amount of boost may be provided or additional amounts of boost may be provided by omitting one or more of the NMOS transistors 235, 236, and 237 or including additional transistors coupled to the node 248.

When the high supply voltage collapse is enabled, asserting one of the bitline control 225 and 227 also completes the voltage collapse by pulling the column supply 221 (or 222) down. Because the column supply 221 (or 222) is pulled down through the PMOS transistor 233 (or 234) the voltage at the column supply 221 (or 222) is limited to the threshold voltage, Vth of the PMOS transistor 233 (or 234). Limiting the minimum voltage at the column supply 221 (or 222) ensures that the column supply 221 (or 222) is above the retention voltage (i.e., the voltage level needed for the storage cell circuit 150 to retain data when neither a read nor a write operation is being performed).

When the voltage collapse is disabled, the n_X1 243 (or n_X2 244) signal is asserted to turn off the PMOS transistor 233 (or 234), preventing a short circuit current between VDD and ground. As the node 248 is pulled to ground via NMOS transistor 235 (or NMOS transistors 236 and 237), the boost node 246 is pulled down to a negative voltage (i.e., a voltage level below the low supply voltage). The level of the negative voltage is based on the voltage divider formed by the boost capacitor 240 and capacitance of the BLB1 211. When the boost node 246 is boosted to a negative voltage, the negative bitline BLB1 211 is boosted to a low voltage. The NMOS transistor 230 should be chosen with a high Vth to prevent charge from leaking onto the boost node 246 and diminishing the negative boost.

To complete the write operation, the pullup 170 within the storage cell circuit 150 must pull the low internal node BLRI high (assuming that boosted bitline 130 is high and boosted bitline 125 is low. So that the pullup 170 can pull the BLRI node high, the column supply voltage 122 should be restored to the high supply voltage level before the word line 135 is negated (i.e., turned off). To keep the pullup 170 strong, the negative bitline, boosted bitline 125 (coupled to the BLB1 211) should still be boosted as the high supply voltage, e.g., VDD, is restored. Therefore, asserting the n_X1 243 (or n_X2 244) to turn off the PMOS transistor 233 (or 234). If the voltage collapse was enabled, the n_P1 241 (or 242) is negated and the PMOS transistor 231 (or 232) turns on to restore the column supply 221 (or 222) to the high supply voltage level (VDD).

To end the negative bitline boost operation, the NMOS transistor 202 is turned off to allow for precharge of the BLB1 211, and the bitline discharge 210 is asserted to turn on the NMOS transistor 230 so that the boost node 246 is restored to the low supply voltage (ground). The node 248 remains at some unknown voltage based on the tuning of the bitline control 225 and 227. In one embodiment, an NMOS transistor is coupled to the node 248 and configured to pre-discharge the node 248 to the low supply voltage in order to maximize the effect of the high supply voltage collapse operation. The bitline control 225 may be configured to perform the pre-discharge of the node 248.

Generation of the bitline discharge 210, bitline controls 225 and 227, n_P1 241, n_P2 242, n_X1 243, n_X2 244, the word line 135, and the inputs to the NOR gates within the write mux sub-circuit 215 signals may be implemented with standard logic gates and delay chains. At least some of the signals can be shared between multiple columns.

Figure 2B:
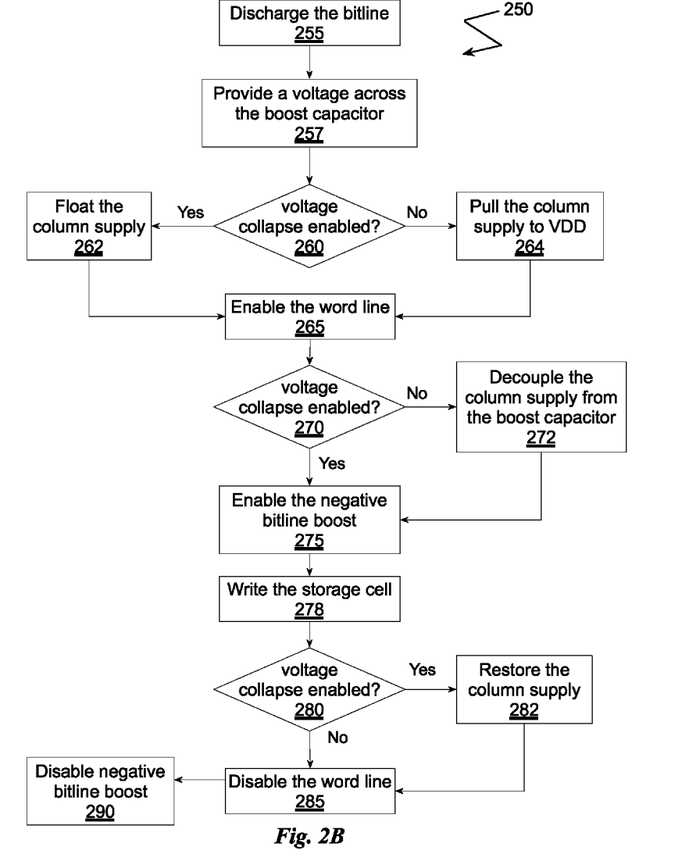
FIG. 2B illustrates another flowchart of a method for performing write assist using supply voltage collapse and negative bitline boost, in accordance with one embodiment.

FIG. 2B illustrates another flowchart of a method 250 for performing write assist using supply voltage collapse and negative bitline boost, in accordance with one embodiment. At step 255, the bitline discharge 210 is asserted to discharge the negative bitline for a write operation and pull the boost node 246 down to the low supply voltage. At step 257, a voltage is provided across the boost capacitor 240 by pulling up the node 248. At step 260, the programmable write assist circuit 200 determines if voltage collapse is enabled, and, if so, at step 262, the column supply is decoupled from the high supply voltage and allowed to float. Otherwise, at step 264, the column supply voltage is maintained at VDD (the high supply voltage). At this point, a voltage is established across the boost capacitor 240 to initialize the write assist operation.

At step 265, the word line 135 is enabled to begin the write operation. At step 270, if high supply voltage collapse is not enabled, then at step 272, the column supply is decoupled from the boost capacitor 240 to prevent a short circuit between VDD and ground before proceeding to step 275. At step 275, the negative bitline boost operation is enabled and the boost node 246 is pulled to a negative voltage to boost the negative bitline below the low supply voltage that is provided to the storage cell circuit 150.

At step 278, the storage cell is written with the data. At step 280, if voltage collapse is enabled, then at step 282 the column supply is restored to the high supply voltage before proceeding to step 285. At step 285, the word line 135 is disabled and at step 290, the negative bitline boost is disabled by pulling the boost node 246 up to the low voltage supply.

Figure 3A:
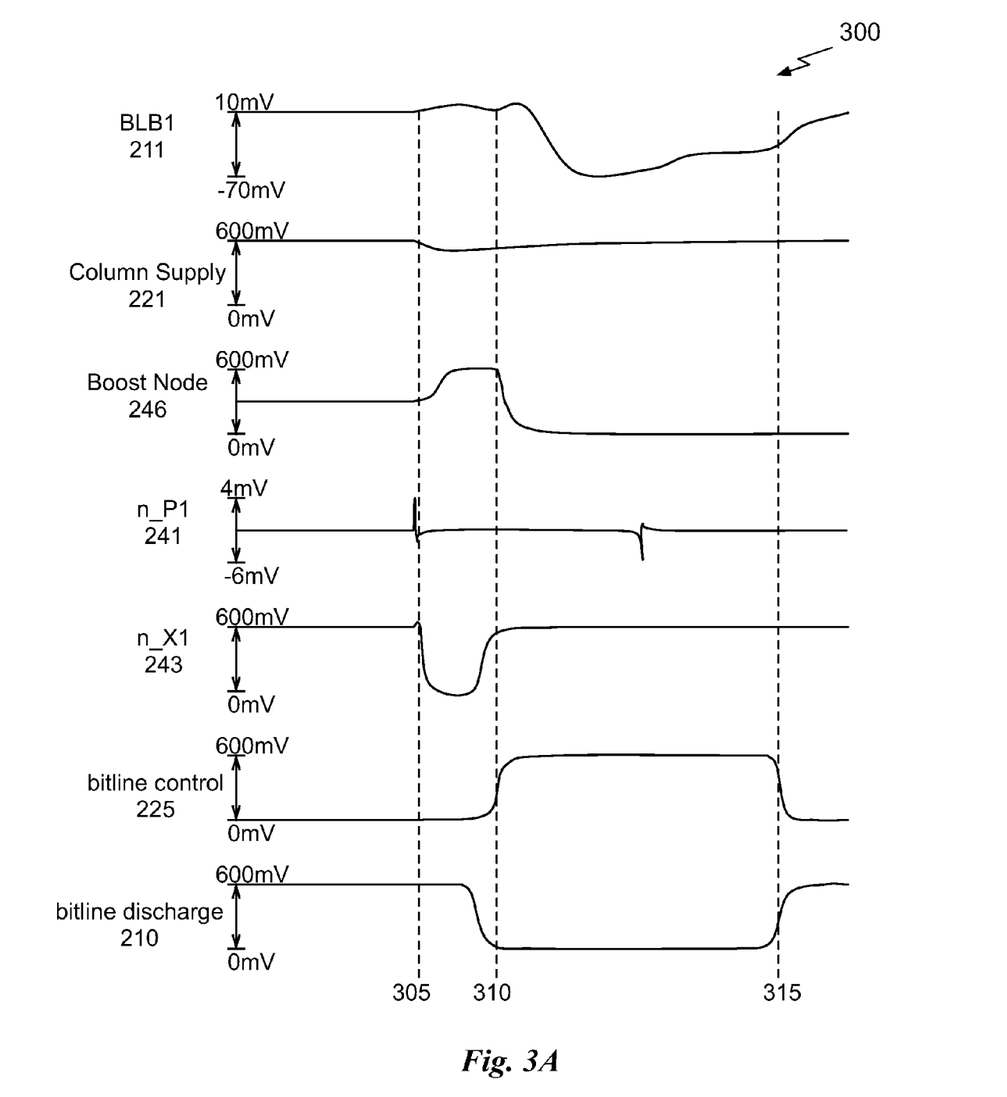
FIG. 3A illustrates timing diagram associated with the programmable write assist circuit of FIG. 2A configured to perform write assist using negative bitline boost, in accordance with one embodiment.

FIG. 3A illustrates timing diagram 300 associated with the programmable write assist circuit 200 of FIG. 2A configured to perform write assist using negative bitline boost, in accordance with one embodiment. The programmable write assist circuit 200 is configured to disable the voltage collapse for the timing diagram 300 and the high supply voltage, VDD, is set to 600 mV.

At the start of the write assist operation, the bitline discharge 210 is asserted so that the boost node 246 is pulled to a low voltage level (10 mV) and the negative bitline BLB1 211 is pulled low (to 10 mV). At time 305, n_X1 243 is negated to pull up the node 248 and provide a voltage across the boost capacitor 240. The boost node 246 increases in response to the increase in the voltage at the node 248. Also, at time 305, n_P1 241 is unchanged because the voltage collapse is not enabled for the waveforms shown in FIG. 3A when the write assist operation is performed. The voltage level reached by the boost node 246 does not quite reach the partially collapsed voltage level of the column supply 221 at time 310.

After time 305 and before time 310, the bitline discharge 210 is negated. At time 310 n_X1 243 is asserted to decouple the column supply 221 from the boost capacitor 240 and prevent a short circuit between the high supply voltage and the low supply voltage. At time 310 the bitline control 225 is asserted to enable the negative bitline boost. The column supply 221 does not collapse further because the voltage collapse is not enabled. At time 310, the boost node 246 is pulled to a lower voltage and the negative bitline, BLB1 211 is boosted to a negative voltage (e.g., −70 mV) between the time 310 and 315. At time 315 the bitline control 225 is negated and the bitline discharge 210 is asserted to disable the negative bitline boost and complete the write assist operation.

Figure 3B:
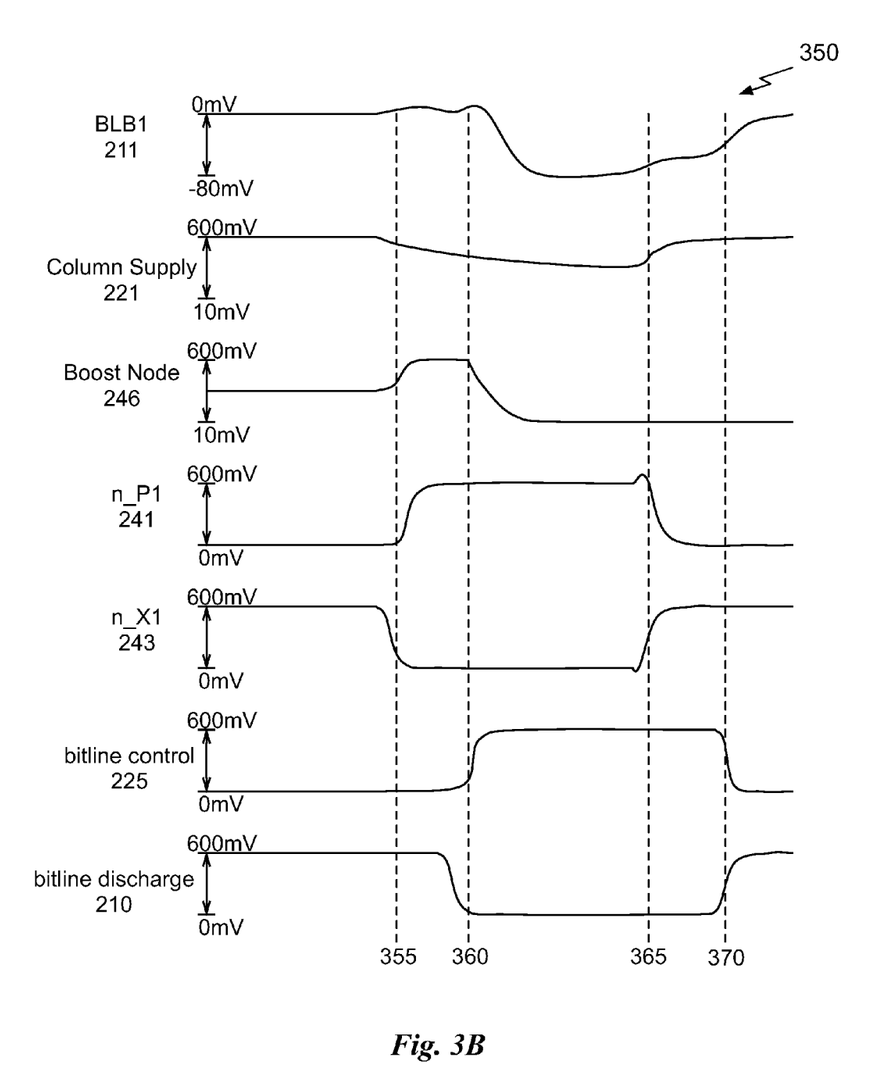
FIG. 3B illustrates timing diagram associated with the programmable write assist circuit of FIG. 2A configured to perform write assist using negative bitline boost and high supply voltage collapse, in accordance with one embodiment.

FIG. 3B illustrates timing diagram 350 associated with the programmable write assist circuit 200 of FIG. 2A configured to perform write assist using negative bitline boost and high supply voltage collapse, in accordance with one embodiment. The programmable write assist circuit 200 is configured to enable the high supply voltage collapse for the timing diagram 350 and the VDD is set to 600 mV.

At the start of the write assist operation, the bitline discharge 210 is asserted so that the boost node 246 is pulled to a low voltage level and the negative bitline, BLB1 211 is at the low supply voltage (0 mV). At time 355, n_P1 241 is asserted to disable the PMOS transistor 231 and float the column supply 221 and n_X1 243 is negated to pull up the node 248 and provide a voltage across the boost capacitor 240. The boost node 246 increases in response to the increase in the voltage at the node 248. The voltage level reached by the boost node 246 substantially equals the partially collapsed voltage level of the column supply 221 at time 360. Efficiency is achieved by charging the boost capacitor 240 as a result of the partial voltage collapse.

Before time 360, the bitline discharge 210 is negated. At time 360 the bitline control 225 is asserted to enable the negative bitline boost. The column supply 221 collapses further from time 360 to time 365 to settle at a collapsed voltage level. At time 360, the boost node 246 is pulled to a lower voltage and the negative bitline, BLB1 211 is boosted to a negative voltage (−80 mV). In order to complete the write operation, at time 365, the n_P1 241 is negated and the n_X1 243 is asserted to restore the column supply 221 to the high supply voltage (600 mV). At time 370, the bitline control 225 is negated and the bitline discharge 210 is asserted to disable the negative bitline boost and complete the write assist operation.

The write assist operation combining the negative bitline boost and the voltage supply collapse provides several advantages in addition to improving write reliability. Typically, the high supply voltage lines for VDD and the bitlines are routed in a metal layer in parallel wires. Therefore, the capacitive coupling between the negative bitline and VDD allows for a smaller boost capacitor 240. A disadvantage of using the voltage supply collapse without the negative bitline boost is that the negative bitline boost decreases the gate voltage on the PMOS pullup transistor that pulls up an internal node during the write operation, thereby strengthening the PMOS pullup to help switch the value stored by the storage element within the storage cell circuit 150. The energy used to partially collapse the high supply voltage is used to help charge the boost capacitor 240. Finally the node 248 is not fully discharged so less energy is needed to recharge the node 248 and provide the voltage across the boost capacitor 240 for the next write assist operation.

Figure 4:
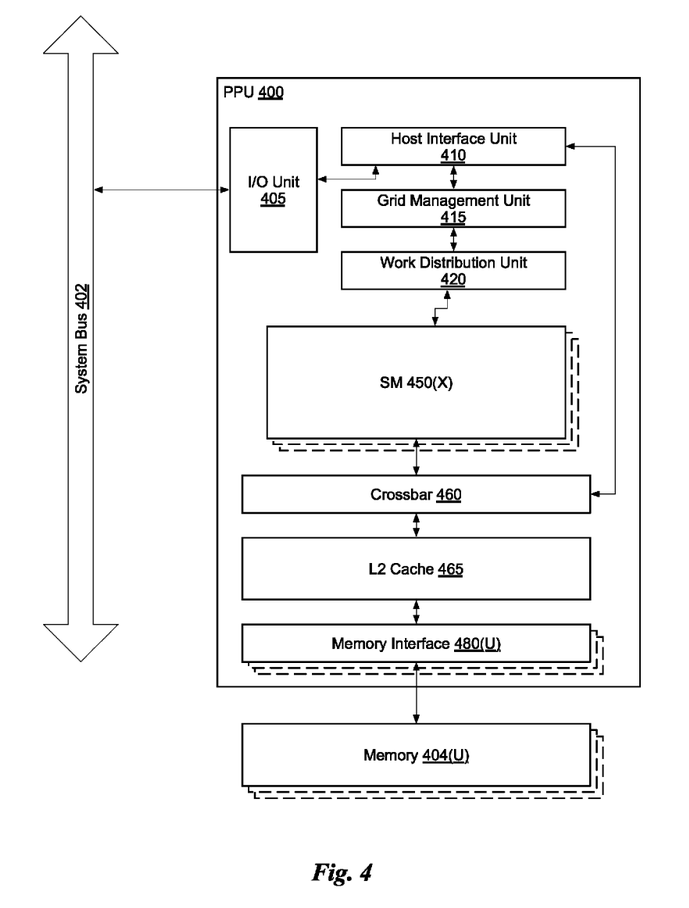
FIG. 4 illustrates a parallel processing unit, in accordance with one embodiment.

FIG. 4 illustrates a PPU 400, according to one embodiment in which the various architecture and/or functionality of the various previous embodiments may be implemented. In particular, the write assist technique implemented by the programmable write assist circuit 200 may be employed for one or more of the memory or register elements that rely on SRAM storage circuitry.

While a parallel processor is provided herein as an example of the PPU 400, it should be strongly noted that such processor is set forth for illustrative purposes only, and any processor may be employed to supplement and/or substitute for the same. In one embodiment, the PPU 400 is configured to execute a plurality of threads concurrently in two or more streaming multi-processors (SMs) 450. A thread (i.e., a thread of execution) is an instantiation of a set of instructions executing within a particular SM 450. Each SM 450, described below in more detail in conjunction with FIG. 5, may include, but is not limited to, one or more processing cores, one or more load/store units (LSUs), a level-one (L1) cache, shared memory, and the like.

In one embodiment, the PPU 400 includes an input/output (I/O) unit 405 configured to transmit and receive communications (i.e., commands, data, etc.) from a central processing unit (CPU) (not shown) over the system bus 402. The I/O unit 405 may implement a Peripheral Component Interconnect Express (PCIe) interface for communications over a PCIe bus. In alternative embodiments, the I/O unit 405 may implement other types of well-known bus interfaces.

The PPU 400 also includes a host interface unit 410 that decodes the commands and transmits the commands to the grid management unit 415 or other units of the PPU 400 (e.g., memory interface 480) as the commands may specify. The host interface unit 410 is configured to route communications between and among the various logical units of the PPU 400.

In one embodiment, a program encoded as a command stream is written to a buffer by the CPU. The buffer is a region in memory, e.g., memory 404 or system memory, that is accessible (i.e., read/write) by both the CPU and the PPU 400. The CPU writes the command stream to the buffer and then transmits a pointer to the start of the command stream to the PPU 400. The host interface unit 410 provides the grid management unit (GMU) 415 with pointers to one or more streams. The GMU 415 selects one or more streams and is configured to organize the selected streams as a pool of pending grids. The pool of pending grids may include new grids that have not yet been selected for execution and grids that have been partially executed and have been suspended.

A work distribution unit 420 that is coupled between the GMU 415 and the SMs 450 manages a pool of active grids, selecting and dispatching active grids for execution by the SMs 450. Pending grids are transferred to the active grid pool by the GMU 415 when a pending grid is eligible to execute, i.e., has no unresolved data dependencies. An active grid is transferred to the pending pool when execution of the active grid is blocked by a dependency. When execution of a grid is completed, the grid is removed from the active grid pool by the work distribution unit 420. In addition to receiving grids from the host interface unit 410 and the work distribution unit 420, the GMU 410 also receives grids that are dynamically generated by the SMs 450 during execution of a grid. These dynamically generated grids join the other pending grids in the pending grid pool.

In one embodiment, the CPU executes a driver kernel that implements an application programming interface (API) that enables one or more applications executing on the CPU to schedule operations for execution on the PPU 400. An application may include instructions (i.e., API calls) that cause the driver kernel to generate one or more grids for execution. In one embodiment, the PPU 400 implements a SIMD (Single-Instruction, Multiple-Data) architecture where each thread block (i.e., warp) in a grid is concurrently executed on a different data set by different threads in the thread block. The driver kernel defines thread blocks that are comprised of k related threads, such that threads in the same thread block may exchange data through shared memory. In one embodiment, a thread block comprises 32 related threads and a grid is an array of one or more thread blocks that execute the same stream and the different thread blocks may exchange data through global memory.

In one embodiment, the PPU 400 comprises X SMs 450 (X). For example, the PPU 400 may include 15 distinct SMs 450. Each SM 450 is multi-threaded and configured to execute a plurality of threads (e.g., 32 threads) from a particular thread block concurrently. Each of the SMs 450 is connected to a level-two (L2) cache 465 via a crossbar 460 (or other type of interconnect network). The L2 cache 465 is connected to one or more memory interfaces 480. Memory interfaces 480 implement 16, 32, 64, 128-bit data buses, or the like, for high-speed data transfer. In one embodiment, the PPU 400 comprises U memory interfaces 480(U), where each memory interface 480(U) is connected to a corresponding memory device 404(U). For example, PPU 400 may be connected to up to 6 memory devices 404, such as graphics double-data-rate, version 5, synchronous dynamic random access memory (GDDR5 SDRAM).

In one embodiment, the PPU 400 implements a multi-level memory hierarchy. The memory 404 is located off-chip in SDRAM coupled to the PPU 400. Data from the memory 404 may be fetched and stored in the L2 cache 465, which is located on-chip and is shared between the various SMs 450. In one embodiment, each of the SMs 450 also implements an L1 cache. The L1 cache is private memory that is dedicated to a particular SM 450. Each of the L1 caches is coupled to the shared L2 cache 465. Data from the L2 cache 465 may be fetched and stored in each of the L1 caches for processing in the functional units of the SMs 450.

In one embodiment, the PPU 400 comprises a graphics processing unit (GPU). The PPU 400 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 400 can be configured to process the graphics primitives to generate a frame buffer (i.e., pixel data for each of the pixels of the display). The driver kernel implements a graphics processing pipeline, such as the graphics processing pipeline defined by the OpenGL API.

An application writes model data for a scene (i.e., a collection of vertices and attributes) to memory. The model data defines each of the objects that may be visible on a display. The application then makes an API call to the driver kernel that requests the model data to be rendered and displayed. The driver kernel reads the model data and writes commands to the buffer to perform one or more operations to process the model data. The commands may encode different shader programs including one or more of a vertex shader, hull shader, geometry shader, pixel shader, etc. For example, the GMU 415 may configure one or more SMs 450 to execute a vertex shader program that processes a number of vertices defined by the model data. In one embodiment, the GMU 415 may configure different SMs 450 to execute different shader programs concurrently. For example, a first subset of SMs 450 may be configured to execute a vertex shader program while a second subset of SMs 450 may be configured to execute a pixel shader program. The first subset of SMs 450 processes vertex data to produce processed vertex data and writes the processed vertex data to the L2 cache 465 and/or the memory 404. After the processed vertex data is rasterized (i.e., transformed from three-dimensional data into two-dimensional data in screen space) to produce fragment data, the second subset of SMs 450 executes a pixel shader to produce processed fragment data, which is then blended with other processed fragment data and written to the frame buffer in memory 404. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The PPU 400 may be included in a desktop computer, a laptop computer, a tablet computer, a smart-phone (e.g., a wireless, hand-held device), personal digital assistant (PDA), a digital camera, a hand-held electronic device, and the like. In one embodiment, the PPU 400 is embodied on a single semiconductor substrate. In another embodiment, the PPU 400 is included in a system-on-a-chip (SoC) along with one or more other logic units such as a reduced instruction set computer (RISC) CPU, a memory management unit (MMU), a digital-to-analog converter (DAC), and the like.

In one embodiment, the PPU 400 may be included on a graphics card that includes one or more memory devices 404 such as GDDR5 SDRAM. The graphics card may be configured to interface with a PCIe slot on a motherboard of a desktop computer that includes, e.g., a northbridge chipset and a southbridge chipset. In yet another embodiment, the PPU 400 may be an integrated graphics processing unit (iGPU) included in the chipset (i.e., Northbridge) of the motherboard.

Figure 5:
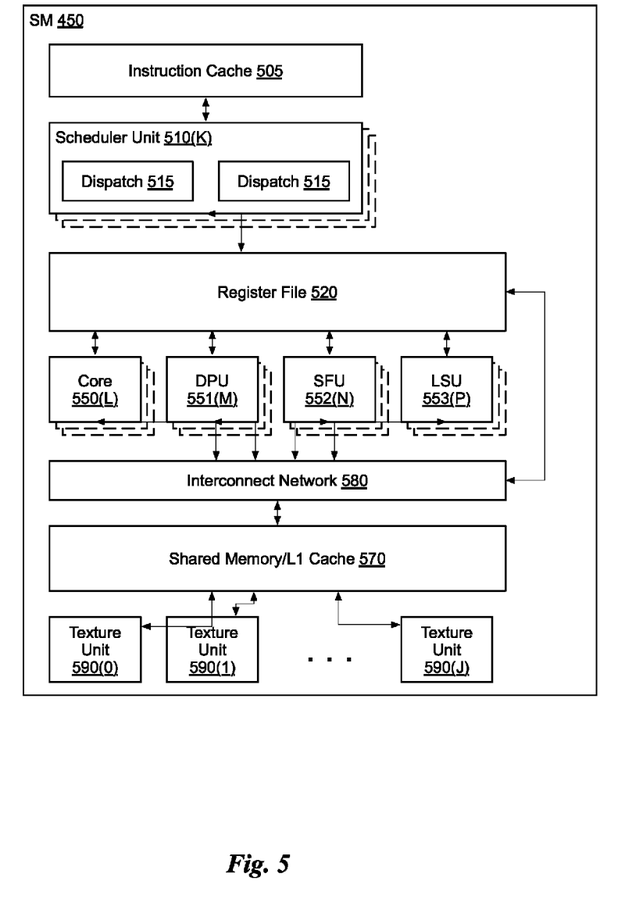
FIG. 5 illustrates the streaming multi-processor of FIG. 4, in accordance with one embodiment.

FIG. 5 illustrates the streaming multi-processor 450 of FIG. 4, according to one embodiment. As shown in FIG. 5, the SM 450 includes an instruction cache 505, one or more scheduler units 510, a register file 520, one or more processing cores 550, one or more double precision units (DPUs) 551, one or more special function units (SFUs) 552, one or more load/store units (LSUs) 553, an interconnect network 580, a shared memory/L1 cache 570, and one or more texture units 590.

As described above, the work distribution unit 420 dispatches active grids for execution on one or more SMs 450 of the PPU 400. The scheduler unit 510 receives the grids from the work distribution unit 420 and manages instruction scheduling for one or more thread blocks of each active grid. The scheduler unit 510 schedules threads for execution in groups of parallel threads, where each group is called a warp. In one embodiment, each warp includes 32 threads. The scheduler unit 510 may manage a plurality of different thread blocks, allocating the thread blocks to warps for execution and then scheduling instructions from the plurality of different warps on the various functional units (i.e., cores 550, DPUs 551, SFUs 552, and LSUs 553) during each clock cycle.

In one embodiment, each scheduler unit 510 includes one or more instruction dispatch units 515. Each dispatch unit 515 is configured to transmit instructions to one or more of the functional units. In the embodiment shown in FIG. 5, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 450 includes a register file 520 that provides a set of registers for the functional units of the SM 450. In one embodiment, the register file 520 is divided between each of the functional units such that each functional unit is allocated a dedicated portion of the register file 520. In another embodiment, the register file 520 is divided between the different warps being executed by the SM 450. The register file 520 provides temporary storage for operands connected to the data paths of the functional units.

Each SM 450 comprises L processing cores 550. In one embodiment, the SM 450 includes a large number (e.g., 192, etc.) of distinct processing cores 550. Each core 550 is a fully-pipelined, single-precision processing unit that includes a floating point arithmetic logic unit and an integer arithmetic logic unit. In one embodiment, the floating point arithmetic logic units implement the IEEE 754-2008 standard for floating point arithmetic. Each SM 450 also comprises M DPUs 551 that implement double-precision floating point arithmetic, N SFUs 552 that perform special functions (e.g., copy rectangle, pixel blending operations, and the like), and P LSUs 553 that implement load and store operations between the shared memory/L1 cache 570 and the register file 520. In one embodiment, the SM 450 includes 64 DPUs 551, 32 SFUs 552, and 32 LSUs 553.

Each SM 450 includes an interconnect network 580 that connects each of the functional units to the register file 520 and the shared memory/L1 cache 570. In one embodiment, the interconnect network 580 is a crossbar that can be configured to connect any of the functional units to any of the registers in the register file 520 or the memory locations in shared memory/L1 cache 570.

In one embodiment, the SM 450 is implemented within a GPU. In such an embodiment, the SM 450 comprises J texture units 590. The texture units 590 are configured to load texture maps (i.e., a 2D array of texels) from the memory 404 and sample the texture maps to produce sampled texture values for use in shader programs. The texture units 590 implement texture operations such as anti-aliasing operations using mip-maps (i.e., texture maps of varying levels of detail). In one embodiment, the SM 450 includes 16 texture units 590.

The PPU 400 described above may be configured to perform highly parallel computations much faster than conventional CPUs. Parallel computing has advantages in graphics processing, data compression, biometrics, stream processing algorithms, and the like.

Figure 6:
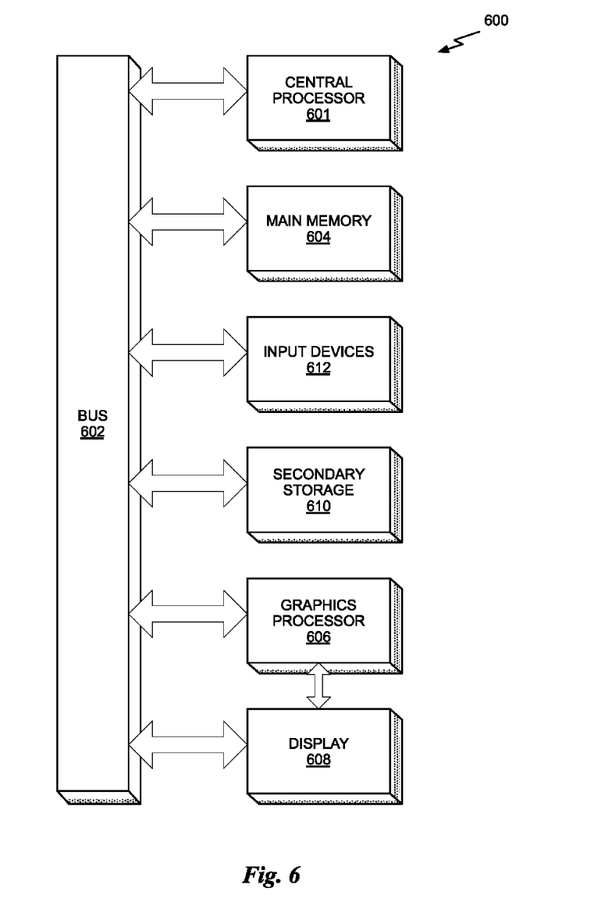
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the secondary storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
   initializing write assist circuitry;
   initiating a voltage collapse to reduce a column supply voltage provided to a storage cell;
   charging a boost capacitor;
   boosting, using the boost capacitor, a bitline of the storage cell to a boosted voltage level that is below a low supply voltage provided to the storage cell; and
   writing data encoded by the bitline to the storage cell.

2. The method of claim 1, wherein the voltage collapse comprises partially collapsing the column supply voltage provided to the storage cell to a partially collapsed voltage level that is lower than a high supply voltage while simultaneously charging the boost capacitor.

3. The method of claim 2, wherein the voltage collapse further comprises completing the voltage collapse by pulling down the column supply voltage provided to the storage cell to a collapsed voltage level.

4. The method of claim 1, further comprising restoring the column supply voltage to the storage cell to a high voltage supply to complete the writing of the data.

5. A method comprising:
   initializing write assist circuitry;
   initiating a voltage collapse to reduce a column supply voltage provided to a storage cell;
   boosting a bitline of the storage cell to a boosted voltage level that is below a low supply voltage provided to the storage cell;
   writing data encoded by the bitline to the storage cell; and
   disabling the boosting to restore the bitline to the low supply voltage after the writing.

6. The method of claim 1, further comprising configuring the write assist circuitry to disable both boosting of the bitline and initiating the voltage collapse for a read operation.

7. The method of claim 1, wherein the write assist circuitry is configured to boost the bitline of the storage cell by at least two different amounts.

8. The method of claim 1, further comprising:
   configuring the write assist circuitry to disable the voltage collapse;
   boosting the bitline of the storage cell; and
   writing second data encoded by the bitline to the storage cell.

9. The method of claim 1, wherein the write assist circuitry is shared between two or more columns within an array of storage cells.

10. An integrated circuit comprising:
    a storage cell circuit; and
    a write assist circuit that is coupled to the storage cell circuit and configured to:
      initiate voltage collapse to reduce a column supply voltage provided to the storage cell in response to a write request;
      establish a voltage across a boost capacitor;
      boost a bitline of the storage cell to a boosted voltage level that is below a low supply voltage provided to the storage cell; and
      write data encoded by the bitline to the storage cell.

11. The integrated circuit of claim 10, wherein the write assist circuit is further configured to partially collapse the column supply voltage provided to the storage cell to a partially collapsed voltage level that is lower than a high supply voltage while simultaneously charging the boost capacitor.

12. The integrated circuit of claim 11, wherein the write assist circuit is further configured to complete the voltage collapse by pulling down the column supply voltage provided to the storage cell to a collapsed voltage level.

13. The integrated circuit of claim 10, wherein the write assist circuit is further configured to restore the column supply voltage to a high supply voltage to complete the writing of the data.

14. The integrated circuit of claim 10, wherein the write assist circuit is further configured to disable the boost of the bitline to restore the bitline to the low supply voltage after the data is written.

15. The integrated circuit of claim 10, wherein the write assist circuitry is further configured to disable both boosting of the bitline and initiating the voltage collapse for a read operation.

16. The integrated circuit of claim 10, wherein the write assist circuitry is further configured to:
    disable the voltage collapse;
    boost the bitline of the storage cell; and
    write second data encoded by the bitline to the storage cell.

17. The integrated circuit of claim 10, wherein the write assist circuit is further configured to boost the bitline of the storage cell by at least two different amounts according to a control signal.

18. The integrated circuit of claim 10, wherein the write assist circuit is shared between two or more columns within an array of storage cells.

19. The method of claim 5, further comprising restoring the column supply voltage to the storage cell to a high voltage supply to complete the writing of the data.

20. The method of claim 5, further comprising configuring the write assist circuitry to disable both boosting of the bitline and initiating the voltage collapse for a read operation.

* * * * *